United States Patent [19]

Petty et al.

[11] Patent Number: 5,057,709
[45] Date of Patent: Oct. 15, 1991

[54] CURRENT THRESHOLD DETECTOR CIRCUIT

[75] Inventors: Thomas D. Petty; Robert L. Vyne, both of Tempe, Ariz.

[73] Assignee: Motorola Inc., Schaumburg, Ill.

[21] Appl. No.: 607,961

[22] Filed: Nov. 1, 1990

[51] Int. Cl.⁵ ............................................. H03K 5/153
[52] U.S. Cl. .................................... 307/350; 307/356; 307/363; 323/317; 330/288
[58] Field of Search ...................... 307/299.3, 350, 356, 307/363; 323/315–317; 330/288

[56] References Cited

U.S. PATENT DOCUMENTS 4,525,638 6/1985 Gray ..................................... 307/350

Primary Examiner—James B. Mullins
Attorney, Agent, or Firm—Michael D. Bingham

[57] ABSTRACT

A dectector circuit responsive to a current suppled to an input thereof provides an output signal when the magnitude of the current exceeds a predetermined threshold level includes a multi-collector transistor having a first one of its collectors connected to the base thereof and an emitter coupled to the input. A diode formed by a diode-connected transistor is coupled to the first collector of the multi-collector transistor. A second transistor is provided having its collector coupled to the second collector of the multi-collector transistor, a base coupled to the first collector and an emitter which is coupled to a pair of series connected resistors. The second transistor is operated at a lower current density than the diode-connected transistor such that the former operates in a saturated condition until such time that the input current exceeds the threshold level to produce the output signal.

8 Claims, 1 Drawing Sheet

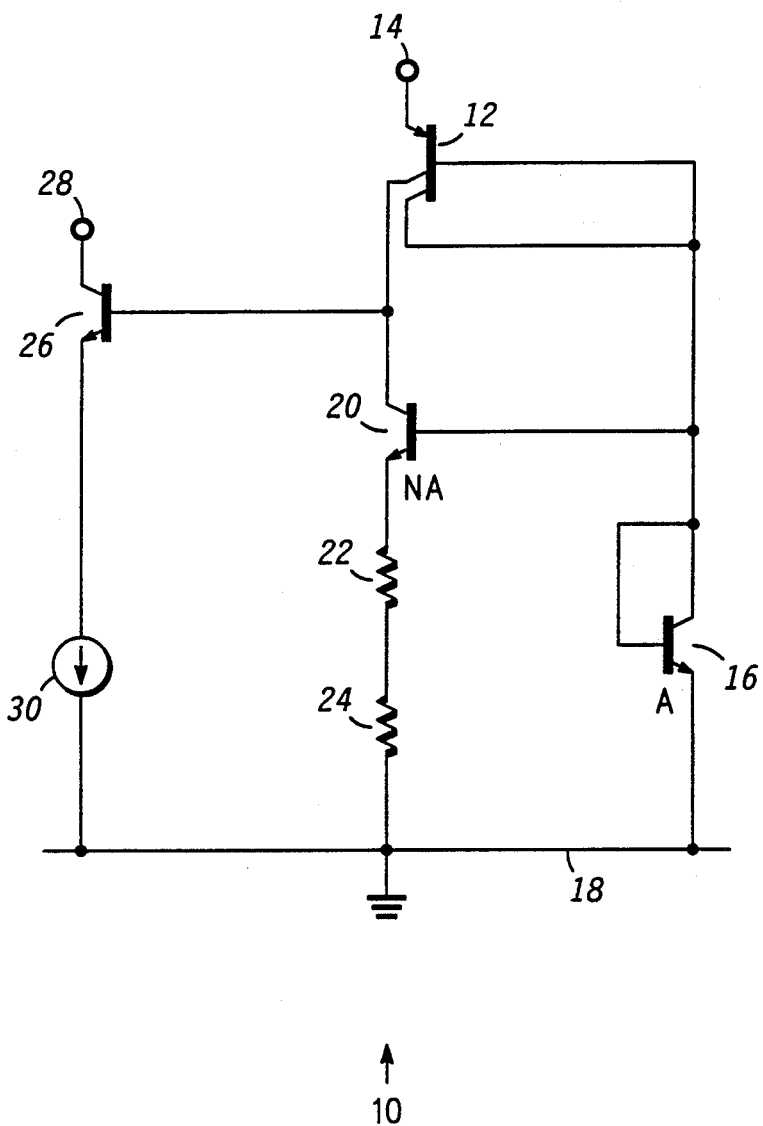

CURRENT THRESHOLD DETECTOR CIRCUIT

CROSS REFERENCE TO A RELATED APPLICATION

The subject application is related to a prior application filed on July 7, 1990, Ser. No. 558,927, by the same Assignee and entitled, "AMPLIFIER HAVING TWO OPERATING MODES".

BACKGROUND OF THE INVENTION

The present invention relates to a method and circuit for detecting when the magnitude of a current exceeds a predetermined threshold value.

Current detectors are utilized in myriad of applications; for instance many regulator circuits are seen in the prior art that require the need to provide a regulated output responsive to a detected current exceeding a threshold value. Another application of a current threshold detector may be to control the operating state of high output current operational amplifiers. In present day applications it is a desired goal to produce amplifiers with low quiescent power consumption but such prior art amplifiers have been deficient in output drive current and alternating current (AC) performance. In fact, it is still the goal to provide an operational amplifier that has high drive current capability in order to drive low impedance loads while also having minimum bias drain current to reduce power consumption. Indeed, in portable battery powered applications such as mobile telephones, consumer entertainment systems e.g., radios and video games etc., it is especially important to limit the quiescent power consumption of amplifiers used in such applications.

Most, if not all, present day high output current operational amplifiers are comprised of an input stage that is coupled to an output stage. In response to an alternating input signal being applied to the input stage, the operational amplifier both sources and sinks current to and from a load coupled to the output stage. Typically, the input and output stages are biased at a quiescent drain current to permit quality audio and data processing applications. For example, low power, high output current amplifiers, such as the MC 33178 manufactured by Motorola, Inc., draw approximately 420 microamperes of drain current per amplifier in the quiescent operating mode with no input signal applied thereto. For micro-power and battery powered applications there is a need to reduce drain current requirements over the foregoing while providing amplifiers that can supply high load currents. One manner in which the foregoing may be accomplished is to utilized circuitry for sensing when the input signal is below a certain threshold value to minimize the current drain of the amplifier and once the input signal exceeds this threshold to increase the bias current to the stages so that the amplifier operates in its intended range.

Hence, there is a need for an improved method and circuit that can provide an output signal which may be utilized to control a load by providing a load control signal when a detected current exceeds a predetermined threshold value.

SUMMARY OF THE INVENTION

Accordingly, it is an object of the present invention to provide an improved method and circuit for detecting a predetermined threshold value of a current supplied thereto.

In accordance with the above and other objects there is provided a method and circuit for detecting when the magnitude of a current exceeds a threshold level including a multi-collector transistor, a diode-connected transistor coupled between a first one of the collectors of the multi-collector transistor and negative supply rail; a second transistor the collector of which is coupled to a second collector of the multi-collector transistor and whose base is coupled to the first collector; and a resistive circuit is coupled between the emitter of the second transistor and the supply rail.

A feature of the invention is that the second transistor is operated at a lower current density than the diode-connected transistor such that the second transistor is maintained in a saturated operating state until such time that the current sourced from the multi-collector transistor, which is proportional to the input current, to the second transistor causes the sum of the voltage drop across the resistive circuit and the base-emitter voltage of the second transistor to become substantially equal to the voltage developed across the diode-connected transistor. At this time the second transistor is no longer saturated whereby additional current sourced from the multi-collector transistor is utilized to signal that the input current has exceeded the threshold level.

BRIEF DESCRIPTION OF THE DRAWING

The single FIGURE is a schematic diagram illustrating the present invention.

DETAILED DESCRIPTION OF THE PREFERRED EMBODIMENT

Turning to the single Figure there is shown current threshold detector circuit 10 of the preferred invention. As understood, detector circuit 10 is suited to be manufactured in integrated circuit form using conventional integrated circuit processing techniques. In fact, detector circuit 10 may be integrated in a single integrated circuit in combination with other circuitry to provide a necessary control signal; such an application may be in combination with an operational amplifier. Detector circuit 10 includes a multi-collector PNP transistor 12 the emitter of which is coupled to input 14 to which a current is applied. A first collector of transistor 12 is coupled with the base thereof to the emitter of diode-connected transistor 16. As known, transistor 16 operates as a diode having its base and collector interconnected and, as shown, returned to the first collector of transistor 12 while its emitter is returned to negative supply rail 18. The second collector of transistor 12 is coupled both to the collector of transistor 20 and the base of output transistor 26. The base of transistor 20 is returned to the base/collector or anode of diode-connected transistor 16 while its emitter is returned to terminal 18 via series connected resistors 22 and 24. Hence, transistors 16, 20 and resistors 22 and 24 form a current mirror. The output control signal of detector circuit 10 is provided at output 28 which is coupled to the collector of transistor 26 while its emitter is returned to terminal 18 via, for example, current source 30.

Transistor 12 detects the presence of an input current sourced to its emitter and sources first and second currents responsive thereto from the collectors thereof. If the collector areas of the two collectors of transistor 12 have a ratio of one then equal currents, proportional to the input current, are sourced both to diode 16 and the collector of transistor 20, i.e., the current sourced to transistor 12 is evenly split between the collectors of the device (it is understood that by ratioing the collector regions that an uneven split of the currents is possible). As shown, by emitter area ratioing of transistors 16 and 20, where the emitter area of transistor 20 is N times the area of the emitter of transistor 16, transistor 20 will be maintained in a saturated condition until such time that the magnitude of the input current is such that the currents sourced from transistor 12 reaches a predetermined value or threshold. Because transistor 20 is biased by diode-connected transistor 16, it will sink a of current proportional to the latter as the two transistors form a current mirror. For small voltage drops across resistors 22 and 24, due to emitter area ratioing, transistor 20 wants to sink N times the current of the smaller geometry transistor 16. Hence, since the collector currents sourced from transistor 12 are equal but less than the current required by transistor 20 as long as the input current to input 14 is below a predetermined threshold, transistor 20 is forced to sink less current than it requires; this causes the transistor to be saturated. Therefore, by operating transistors 16 and 20 at different current densities (by emitter area ratioing) transistor 20 is operated in a saturated condition and no base drive current is available to transistor 26 thereby maintaining the latter in an non-conducting state as long as the input current supplied to input 14 is below the predetermined threshold level. Thus, as transistors 16 and 20 are operated at different current densities, a difference voltage $\Delta V_{BE}$ appears across resistors 22 and 24 such that the sum of the difference voltage and the base-emitter voltage of transistor 20 is equal to the voltage drop across diode-connected transistor 16. As the input current increases the currents supplied to transistors 16 and 20 will also increase. Transistor 20 will remain saturated until the current supplied from the collector of transistor 12 to the collector of transistor 20 becomes equal to or greater than the value $kT/qR (\ln N)$: where R is the resistance of resistors 22 and 24; k is Boltzmann's constant, T is absolute temperature and q is charge of an electron. This occurs when the magnitude of the input current reaches the threshold level wherein any further increase produces excess current to turn on transistor 26. Transistor 26 is therefore turned on at this threshold level to source the current I30 of current supply 30 to provide an output control signal at output 28. It is noted that resistors 22 and 24 may be formed in the integrated circuit of different semiconductor material such that their individual temperature coefficients differ. In this manner, the temperature coefficient of $\Delta V_{BE}$ can be offset whereby the detector circuit has an overall temperature coefficient such that the switching point thereof does not vary with temperature.

Hence, what has been described above is a novel current detector circuit for detecting when an input current supplied thereto exceeds a given threshold level for providing an output signal at such time. The invention proceeds on the concept of (1) detecting the input current to produce first and second equal currents that are proportional to the input current, (2) utilizing the first and second currents to operate a pair of transistors at different current densities to develop a difference voltage therebetween such that one of the transistors is maintained in a saturated condition until the input current reaches a threshold level, and (5) producing a control current responsive to the input current exceeding the given threshold level as the one transistor is no longer in saturation.

What is claimed is:

1. A current threshold detection circuit having an input and an output, comprising:

a first transistor having first, second and third electrodes and a control electrode, said first electrode being coupled to the input of the circuit to which an input current is sourced, said second electrode being coupled to said control electrode wherein said first transistor is rendered conducting responsive to said input current for sourcing first and second currents at said second and third electrodes;

diode means coupled between said second electrode of said first transistor and a terminal to which a supply potential is applied, said diode means developing a potential thereacross as current flows therethrough;

a second transistor having first, second and control electrodes, said second electrode being coupled to said third electrode of said first transistor and said control electrode being coupled to said second electrode of said first transistor, said second transistor being operated at a different current density than said diode means which produces a difference voltage therebetween;

resistive means coupled between said first electrode of said second transistor and said terminal across which said difference voltage is developed to set the current flow therethrough, said second transistor being maintained in a saturated operating condition until such time as said current flow through said resistive means substantially equals said second current; and output circuit means coupled between said third electrode of said first transistor and the output of the circuit for providing an output current responsive to said second transistor becoming non-saturated.

2. The circuit of claim 1 wherein said diode means includes a third transistor having first, second and control electrodes, said first electrode being coupled to said terminal and said second and control electrodes being interconnected to said second electrode of said first transistor.

3. The circuit of claim 2 wherein said resistive means includes first and second serially connected resistors.

4. The circuit of claim 3 wherein said output circuit means includes a fourth transistor having first, second and control electrodes, said second electrode being coupled to the output of the circuit and said control electrode being coupled to said third electrode of said first transistor, and a current supply coupled between said first electrode of said fourth transistor and said terminal.

5. A circuit having an input to which a current is sourced and an output, the circuit providing an output signal responsive to the current exceeding a predetermined threshold value, comprising:

a first transistor having an emitter, first and second collectors and a base, said emitter being coupled to the input of the circuit, said first collector being connected to said base;

a diode coupled to said first collector of said first transistor;

a second transistor having an emitter, a collector and a base, said collector being coupled to said second collector of said first transistor and said base being coupled to said first collector of said of said first transistor; and first and second serially coupled resistors coupled between said emitter of said second transistor and a power supply terminal.

6. The circuit of claim 5 wherein said diode comprises a third transistor having an emitter coupled to said terminal, a base and a collector, said base and collector being interconnected to said first collector of said first transistor and said emitter having a predetermined area.

7. The circuit of claim 6 wherein said emitter of said second transistor having a predetermined area which area is ratioed with respect to said emitter area of said third transistor.

8. The circuit of claim 7 including a fourth transistor having a base coupled to said collector of said second transistor, a collector coupled to an output of the circuit, an emitter; and a current supply coupled between said emitter and said terminal.

* * * * *